United States Patent
Schoppe et al.

(10) Patent No.: US 12,484,174 B2
(45) Date of Patent: Nov. 25, 2025

(54) MOUNTING ASSEMBLY FOR MOUNTING AT LEAST TWO ELECTRICAL MODULES ARRANGEABLE AT DIFFERENT LEVELS ABOVE ONE ANOTHER, AND DEVICE ASSEMBLY COMPRISING SUCH MOUNTING ASSEMBLY

(71) Applicant: Phoenix Contact GmbH & Co. KG, Blomberg (DE)

(72) Inventors: Mathias Schoppe, Fuerstenberg (DE); Joerg Wegener, Lage (DE); Burkhard Schollaehn, Detmold (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 61 days.

(21) Appl. No.: 18/247,750

(22) PCT Filed: Oct. 4, 2021

(86) PCT No.: PCT/EP2021/077258
§ 371 (c)(1),
(2) Date: Apr. 4, 2023

(87) PCT Pub. No.: WO2022/073910
PCT Pub. Date: Apr. 14, 2022

(65) Prior Publication Data
US 2023/0389210 A1      Nov. 30, 2023

(30) Foreign Application Priority Data
Oct. 5, 2020    (BE) .................................. 2020/5687

(51) Int. Cl.
*H05K 7/02*        (2006.01)
*H05K 7/14*        (2006.01)

(52) U.S. Cl.
CPC ........... *H05K 7/023* (2013.01); *H05K 7/1474* (2013.01)

(58) Field of Classification Search
None
See application file for complete search history.

(56) References Cited

U.S. PATENT DOCUMENTS

2013/0294035 A1    11/2013   Trinh et al.
2018/0166804 A1*    6/2018   Lessard Fontaine ....................... H02B 1/0523
(Continued)

FOREIGN PATENT DOCUMENTS

DE      3929905 C1    10/1990
DE     19520797 C1     8/1996
(Continued)

OTHER PUBLICATIONS

Phoenix Contact, "Empty polyester enclosure—enclosure with two wiring levels", Mar. 17, 2017 (Mar. 17, 2017), Retrieved from the Internet: URL:https://web.archive.org/web/20170317103611/https://www.phoenixcontact.com/online/portal/pi?1dmy&urile=wcm:path:/pien/web/main/products/subcategory_pages/polyester_empty_housing_p-09-11, 03/c18399c0-e92a-457d-8f6e-327d523962f3 XP055812840.

*Primary Examiner* — James Wu
*Assistant Examiner* — Christopher L Augustin
(74) *Attorney, Agent, or Firm* — LEYDIG, VOIT & MAYER, LTD.

(57) ABSTRACT

A mounting assembly for mounting at least two electrical modules, which are arrangeable at different levels above one another, includes: a first electrical module arrangeable on a first carrier in a first mounting plane; a second electrical module arrangeable on a second carrier in a second mounting plane arranged above the first mounting plane; a separate first support element on a first side of the first electrical module; and a separate second support element, which is (Continued)

axially spaced apart from the first support element, on a second side of the first electrical module. The second carrier is arrangeable spaced apart from the first carrier above the latter by the first support element and by the second support element.

17 Claims, 4 Drawing Sheets

(56) References Cited

U.S. PATENT DOCUMENTS

2019/0089176 A1* 3/2019 Dunn .................... H02J 7/0013
2021/0014993 A1 1/2021 Gerving et al.

FOREIGN PATENT DOCUMENTS

| DE | 102011051154 A1 | 2/2012 |
| DE | 102010046990 A1 | 4/2012 |
| DE | 102017129217 A1 | 6/2019 |
| EP | 2315325 A1 | 4/2011 |
| EP | 2312696 B1 | 9/2012 |

* cited by examiner

MOUNTING ASSEMBLY FOR MOUNTING AT LEAST TWO ELECTRICAL MODULES ARRANGEABLE AT DIFFERENT LEVELS ABOVE ONE ANOTHER, AND DEVICE ASSEMBLY COMPRISING SUCH MOUNTING ASSEMBLY

CROSS-REFERENCE TO PRIOR APPLICATIONS

This application is a U.S. National Phase application under 35 U.S.C. § 371 of International Application No. PCT/EP2021/077258, filed on Oct. 4, 2021, and claims benefit to Belgian Patent Application No. BE 2020/5687, filed on Oct. 5, 2020. The International Application was published in German on Apr. 14, 2022 as WO/2022/073910 under PCT Article 21(2).

FIELD

The present invention relates to a mounting assembly for mounting at least two electrical modules, which can be arranged at different levels above one another, wherein a first electrical module can be arranged on a first carrier in a first mounting plane, and wherein a second electrical module can be arranged on a second carrier in a second mounting plane arranged above the first mounting plane. The invention further relates to a device assembly comprising a mounting assembly according to the invention.

BACKGROUND

Various mounting assemblies are already known from the prior art. For example, the document DE 10 2010 046 990 A1 thus describes a receiving device with a one-piece carrier, which prevents a circuit board and the contacts thereof from being damaged even during frequent insertion and removal of carrier rail module housings. This is attained in that the module housing can be released from an integral carrier rail of the carrier by pivoting in the direction of the circuit board, wherein the integral carrier rail as well as the holding region of the circuit board are spatially separated in such a way that the carrier rail module housing and the circuit board are mechanically decoupled even in the mounted state.

An adapter for mounting electrotechnical components, which is configured in the form of a standardized carrier rail, in particular top-hat rail, and which has fastening means on its top side for mounting an electrotechnical component and fastening means on its bottom side for mounting on the front plate of an electrotechnical component, is described in the document DE 10 2017 129 217 A1.

The document DE 195 20 797 C1 discloses a switching device, which consists essentially of a carrier plate, a bracket, and a displaceable plate. A circuit breaker, e.g., is latched to the bracket, which is fastened to the carrier plate. After mounting a further switching device on the displaceable plate, the latter can be inserted in a guided manner in the intermediate space formed by the bracket, so that both switching devices are located one behind the other in the operating position.

SUMMARY

In an embodiment, the present invention provides a mounting assembly for mounting at least two electrical modules, which are arrangeable at different levels above one another, comprising: a first electrical module arrangeable on a first carrier in a first mounting plane; a second electrical module arrangeable on a second carrier in a second mounting plane arranged above the first mounting plane; a separate first support element on a first side of the first electrical module; and a separate second support element, which is axially spaced apart from the first support element, on a second side of the first electrical module, wherein the second carrier is arrangeable spaced apart from the first carrier above the latter by the first support element and by the second support element.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides a mounting assembly for electrical modules, by means of which an installation space-optimized arrangement within a control cabinet or the like can be ensured. A simple and safe mounting and maintenance of the electrical modules to be mounted is to furthermore be made possible in an advantageous manner. In an embodiment, the invention provides a corresponding device assembly, comprising a mounting assembly of this type.

In an embodiment, the present invention provides a mounting assembly for mounting at least two electrical modules, which can be arranged at different levels above one another. A mounting assembly according to the invention is equipped in such a way that a first electrical module can be arranged on a first carrier in a first mounting plane, and that a second electrical module can be arranged on a second carrier in a second mounting plane arranged above the first mounting plane. A first support element is thereby provided on a first side of the first electrical module, and a second support element, which is axially spaced apart from the first support element, is provided on a second side of the first electrical module, so that the second carrier can be arranged spaced apart from the first carrier by means of the first support element and by means of the second support element. The advantage of an installation space-optimized arrangement of electrical modules is attained thereby. In particular in the case of the arrangement of electrical modules in control cabinets, a solution can be provided, which utilizes the installation space depth in a control cabinet by means of the structurally simply constructed and space-saving construction of the mounting assembly.

In terms of the invention, electrical modules are understood in particular to be electrical and electronic switching devices as well as electrical boards (e.g. in the form of individually assembled circuit boards) with signal processing and/or signal display (or signal indicator), but also simple transfer boards, via which only connections of different conductors (in particular with different conductor cross-sections) are established.

According to an advantageous design of the invention, it can be provided that the first carrier and/or the second carrier is/are configured as carrier rail. The first carrier and/or the second carrier are advantageously configured as carrier rail with a top-hat profile, the first carrier and/or the second carrier are in particular configured as carrier rail according to DIN EN 60 715, VDE 0611-3, DIN EN 60947-7-2, VDE 0660-520. The first electrical module can be mounted, for example, directly on a wall of a control cabinet, a support element can in each case be fastened to the wall on the left and right next to the electrical module, and a second electrical module can be arranged on a second carrier, held by the support elements, spaced apart from one another at different levels, in front of or above the first electrical module. The second electrical module can thereby likewise be fastened to a mounting plate. Alternatively, however, the first electrical module and/or the second electrical module can in fact also be arranged on a carrier, which is configured as carrier rail or which comprises a carrier rail. The optimization of the installation space can be further improved and the mounting effort can be minimized due to the configuration of the carriers as carrier rail.

According to a likewise advantageous design of the invention, it can furthermore be provided that the first support element has a first receiving arm, which is mounted in a pivotably movable manner transversely to the longitudinal extension of the first carrier, and that the second support element has a second receiving arm, which is mounted in a pivotably movable manner transversely to the longitudinal extension of the first carrier, wherein the second carrier can be arranged on the pivotably movable receiving arms. The reason for the advantageous effect of this design is that the access to the first electrical module can be simplified by a pivoting of the second electrical module.

According to a further particularly preferred embodiment of the invention, it can be provided that the first receiving arm, which is mounted in a pivotably movable manner, and/or the second receiving arm, which is mounted in a pivotably movable manner, can be fixed at least in one position, can in particular be latched via latching means. Thereby, latching means can be provided, via which latching means it is possible to temporarily fix the second carrier, and thus the second electrical module mounted on the second carrier, in a pivoted-out operating position, in which the first electrical module is accessible more freely, and/or in a second non-pivoted position, in which the second carrier and the second electrical module mounted thereon are arranged so as to lie in the second mounting plane. This has the advantage that comfortable access to the first electrical module is ensured during a latching in a pivoted operating position, and the pivoted second carrier does not have be held tightly by a technician or has to be fixed otherwise—and that, in a non-pivoted position, an operation of the electrical modules is ensured, during which vibrations of the second carrier as well as an uncontrolled pivoting-open of the second carrier can be largely avoided.

The invention can furthermore also be further developed to the effect that the second carrier is connected to the first support element directly or indirectly in a pivotably movable manner in the direction of the longitudinal extension of the first carrier. The advantageous effect of this design is also due to the fact here that access to the first electrical module can be simplified by a pivoting of the second electrical module. In an operating mounting state of the mounting assembly (pivoted and/or not pivoted), the second carrier can thereby advantageously be fixed to the second support element directly or indirectly via latching means. For example, corresponding latching means can be provided on carrier and support element for this purpose. Here, this also has the advantage, in turn, that comfortable access to the first electrical module is ensured during a latching in a pivoted operating position, and that the pivoted second carrier does not have to held firmly or has to be fixed otherwise by a technician—and that, in a non-pivoted position, an operation of the electrical modules is ensured, during which vibrations of the second carrier as well as an uncontrolled pivoting-open of the second carrier can be largely avoided.

Depending on the conditions on location, the solution with a pivotability of the second carrier transversely to the longitudinal extension of the first carrier (in particular of a carrier rail) or with a pivotability in the direction of the longitudinal extension of the first carrier, in a plane perpendicular to the first mounting plane, can be selected.

In an embodiment, which is an alternative to the above-described embodiment, of the connection of the second carrier to the support elements, it can be provided to further develop the invention to the effect that the second carrier can be fixed to the second support element directly or indirectly via first latching means and to the second support element via second latching means. The second carrier is thereby provided as separate free part for receiving a second electrical module, which, in an operating situation in which the first electrical module has to be accessible, can be removed from the support elements, on which it is held and fixed on both sides via latching means. The second carrier is configured, for example, as separate plate, as separate carrier rail, or as a mounting plate with a carrier rail arranged thereon, which can be latched to the support elements above the first electrical module in the second mounting plane.

This provides a structurally simple and cost-efficient solution of the mounting assembly.

In a further other embodiment of the subject-matter of the invention with regard to the connection of the second carrier to the support elements, it can be provided that the second carrier can be fixed to the first support element directly or indirectly via first guide means and to the second support element via second guide means. The axially spaced-apart support elements in particular have oppositely located guide grooves, which face one another and into which the second carrier can then be inserted accordingly. A structurally simple solution for arranging the second carrier on the support elements can also be provided with this. The first and the second guide means, which are configured as guide grooves, advantageously have elastic play compensating means, via which the second carrier experiences a contact pressure, which fixes it, within the guide. An unwanted displacement of the carrier in the guide grooves is reliably prevented thereby and a reliable positioning of the carrier is ensured.

All embodiments have in common that they can have play compensating means (for instance in the form of spring elements, such as leaf springs or in the form of elastomers or the like), as they have been described above, in order to prevent corresponding unwanted displacements as well as unwanted vibrations of the second carrier with respect to one or both support elements.

In the case of all embodiments, it can also be provided to provide securing means, which limit the second carrier in its displacement path in the second mounting plane. For example, the second carrier can be prevented from falling out of receptacles of the support elements in this way because the carrier is configured as free part, which is configured non-captively on one of the support elements. A tilting of the carrier with respect to the pivot axis can also be prevented by means of such a securing element on the other securing element in the case of a connection, which is pivotably movable on one side, of the second carrier to one of the support elements.

According to a further preferred further development of the invention, it can also be provided that the first carrier, which comprises in particular one carrier rail, and the second carrier, which comprises in particular one carrier rail, are aligned in parallel in their longitudinal extension. In an embodiment of the invention, which may be designed alternatively thereto, it may be provided that the first carrier, which comprises in particular one carrier rail, and the second carrier, which comprises in particular one carrier rail, are aligned orthogonally to one another in their longitudinal extension, wherein in particular the second carrier is configured as carrier rail, which is arranged on a mounting plate. In the event that the second carrier comprises a mounting plate with top-hat rail mounted thereon, the mounting plate can have corresponding ventilation openings. The mounting plate is then preferably configured as perforated plate or grid plate. Depending on the situation on location, a flexible adaptation to the installation space situation can be ensured with this by means of two different modular structures of the mounting assembly.

According to a further particularly preferred embodiment of the invention, it can be provided that the first support element and/or the second support element are configured as disk-like side parts, which, on their front side facing the first carrier, each comprise a base section with a recess for connection to the first carrier, which is configured in a rail-like (in particular top-hat rail-like) manner. A particularly simple and space-saving connection of the support elements within the mounting assembly can be attained with this.

The invention can furthermore also be further developed to the effect that, starting at the base section viewed in the side view, the first support element and/or the second support element are essentially configured in an L-shaped manner. The free L-leg is thereby preferably aligned and configured in such a way that the pivot axis of the attached carrying arms lies in the region of its free end, so that a pivoting of the second carrier in the direction of the free end ensures the best possible access to the first electrical module.

In an embodiment, the invention provides a device assembly, comprising a mounting assembly, which is configured according to the invention, wherein a first electrical module is arranged on the first carrier, and wherein a second electrical module is arranged on the second carrier.

It can also be advantageous to further develop the device assembly to the effect that the first electrical module is configured as a module, for example in the form of a so-called electrical board, with output lines with a first line cross-section, and that the second electrical module is configured as transfer module, which receives the output lines of the first electrical module on the input side, and which can be equipped on the output side with transfer board output lines with a line cross-section, which is enlarged compared to the first line cross-section, so that larger line lengths between the first electrical module and a further electrical module, which is to be connected thereto, are made possible. The advantage, which can be realized thereby, is that maximally possible line paths between the first electrical module and a third module, which is to be connected thereto, outside of the control cabinet can be enlarged. If, for example, the maximally permissible line length between a first electrical module and a third electrical module (electrical device), which is to be electrically connected thereto, is limited to 36 m because of the output-side line cross-sections of the output lines of, for example, 0.14 $mm^2$ of the first electrical module, the maximum line length can be widened in that the first electrical module is interconnected with its output lines with the second electrical module, which is configured as transfer module, and the third electrical module (device) is wired from the second electrical module with enlarged line cross-sections (of, for example, 1 $mm^2$ to 2 $mm^2$). Due to the enlarged line cross-sections, line lengths of significantly more than 36 m are then made possible. Line cross-sections between 0.2 $mm^2$ and 2.5 $mm^2$ are advantageously used for flexible connecting lines with enlarged cross-section, while line cross-sections between 0.2 $mm^2$ and 4.0 $mm^2$ are selected for rigidly configured connecting lines with enlarged cross-section.

According to a further design of the device assembly, which is to be preferred, it can be provided that the first electrical module is configured as an electrical securing device without galvanic separation, and that the second electrical module is configured as module providing a galvanic separation, which receives the output lines of the first electrical module on the input side, so that a galvanic separation is realized between the input side of the first electrical module and output side of the second electrical module. Electrical devices without galvanic separation between input and output can thereby be expanded by a corresponding galvanic separation.

Figure 1:
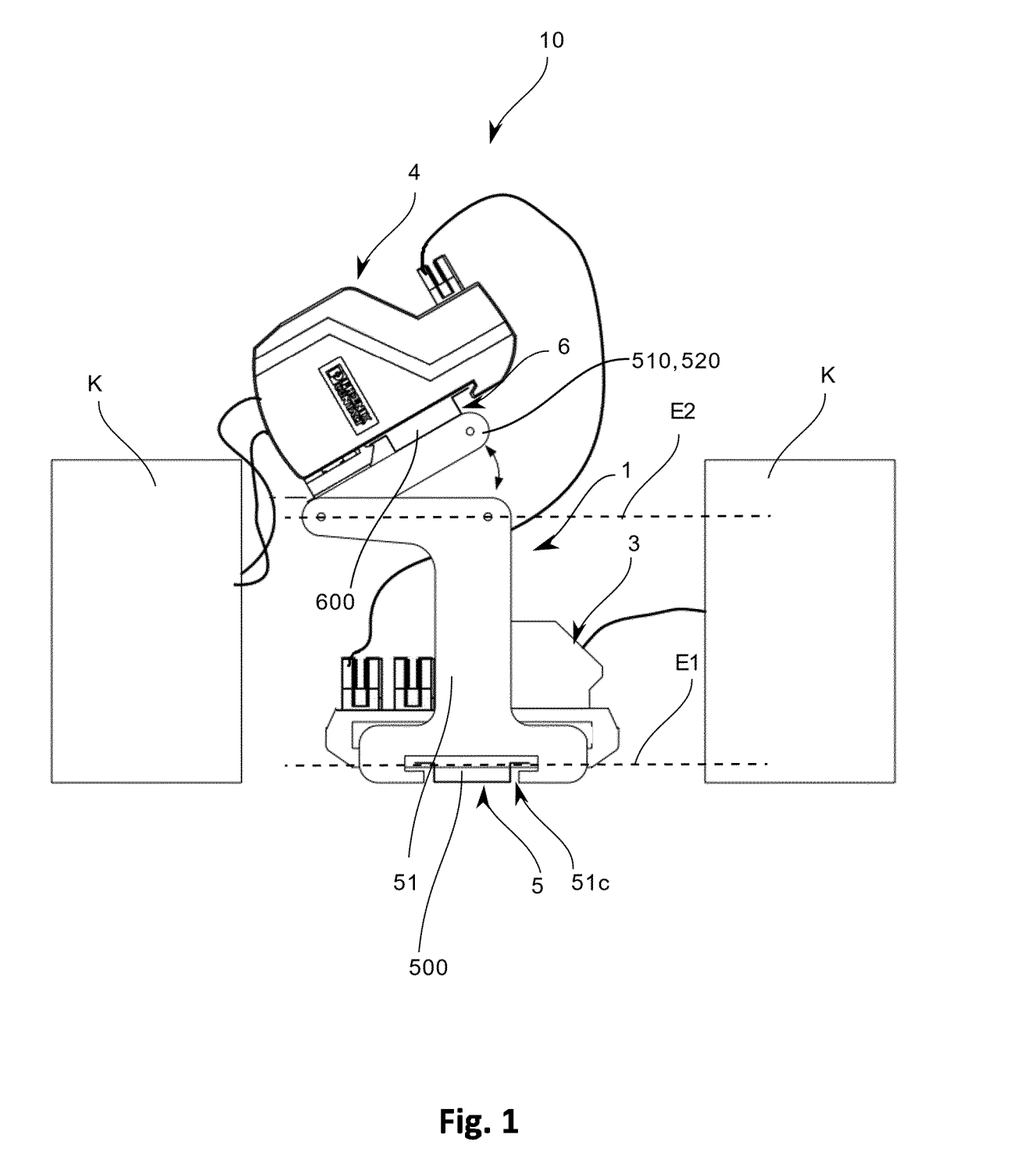
FIG. 1 shows a first embodiment of a device assembly according to the invention, comprising a mounting assembly according to the invention with a first electrical module and with a second electrical module in a side view in the direction of the longitudinal extension of the first carrier configured as carrier rail, in schematic illustration.

FIG. 1 shows a first embodiment of a device assembly 10 according to the invention, comprising a mounting assembly 1 according to the invention with a first electrical module 3 and with a second electrical module 4 in a side view in the direction of the longitudinal extension of the first carrier 5 configured as carrier rail 500, in schematic illustration. The first electrical module 3 is thereby configured, for example, as module of a process control system, and the second electrical module 4 is configured, for example, as so-called transfer module. In the illustrated exemplary embodiment, both electrical modules 3, 4 are mounted to carrier rails 500, 600, which are configured as top-hat rails, wherein the first electrical module 3 is mounted, for example, to the rear wall of a control cabinet via the top-hat rail 500 and thus forms a first mounting plane E1. L-shaped support elements 51, 52, which are configured in a disk-like manner, are mounted to the top-hat rail 500 on the first carrier 5 on both sides of the first electrical module 3. A second mounting plane E2 is formed above the first electrical module 3 via the support elements 51, 52, which are mounted on both sides of the electrical module 3 and which carry a second carrier 6 on their free ends spaced apart from the first carrier 5. The second carrier 6 is likewise configured as top-hat rail 600 here, which, in its longitudinal extension, is arranged parallel to and in the same direction as the top-hat rail 500 of the first carrier 5. As can likewise be seen well in FIG. 1, the first support element 51 has a first receiving arm 510, which is mounted in a pivotably movable manner transversely to the longitudinal extension of the first carrier 5. Located behind it in the shown illustration (not visible here), the second support element 52, analogously to the first support element 51, has a second receiving arm 520, which is mounted in a pivotably movable manner transversely to the longitudinal extension of the first carrier 5, wherein the second carrier 6, which is configured as top-hat rail 600, is fastened to the pivotably movable receiving arms 510, 520, so that, in the event that access to the first electrical module 3 should be required, the mounted second electrical module 4 can be transferred into the illustrated pivoted operating position of the mounting assembly 1 and can be temporarily held therein via non-illustrated latching means.

Cable ducts K are present on both sides of the mounting assembly 1 in the illustrated embodiment. A line is thereby guided out of one of the cable ducts K and is electrically connected to the first electrical module 3. From the first electrical module 3, the first electrical module 3 is electrically connected to the second electrical module 4 located thereabove, via a further electrical line. As is common in process control technology, these two lines can comprise a very small line cross-section. Due to the small line cross-section, the possible line lengths, by means of which the first electrical module 3 could be connected to third devices in the field, are strongly limited. Via a second electrical module 4, which is arranged on the second mounting plane E2 and which is configured as transfer module, a transition can now be made to a larger line cross-section by means of the solution shown here, and significantly longer line paths between the first electrical module 3 and a third device, which is to be connected thereto in the field, can thus be used.

Figure 2:
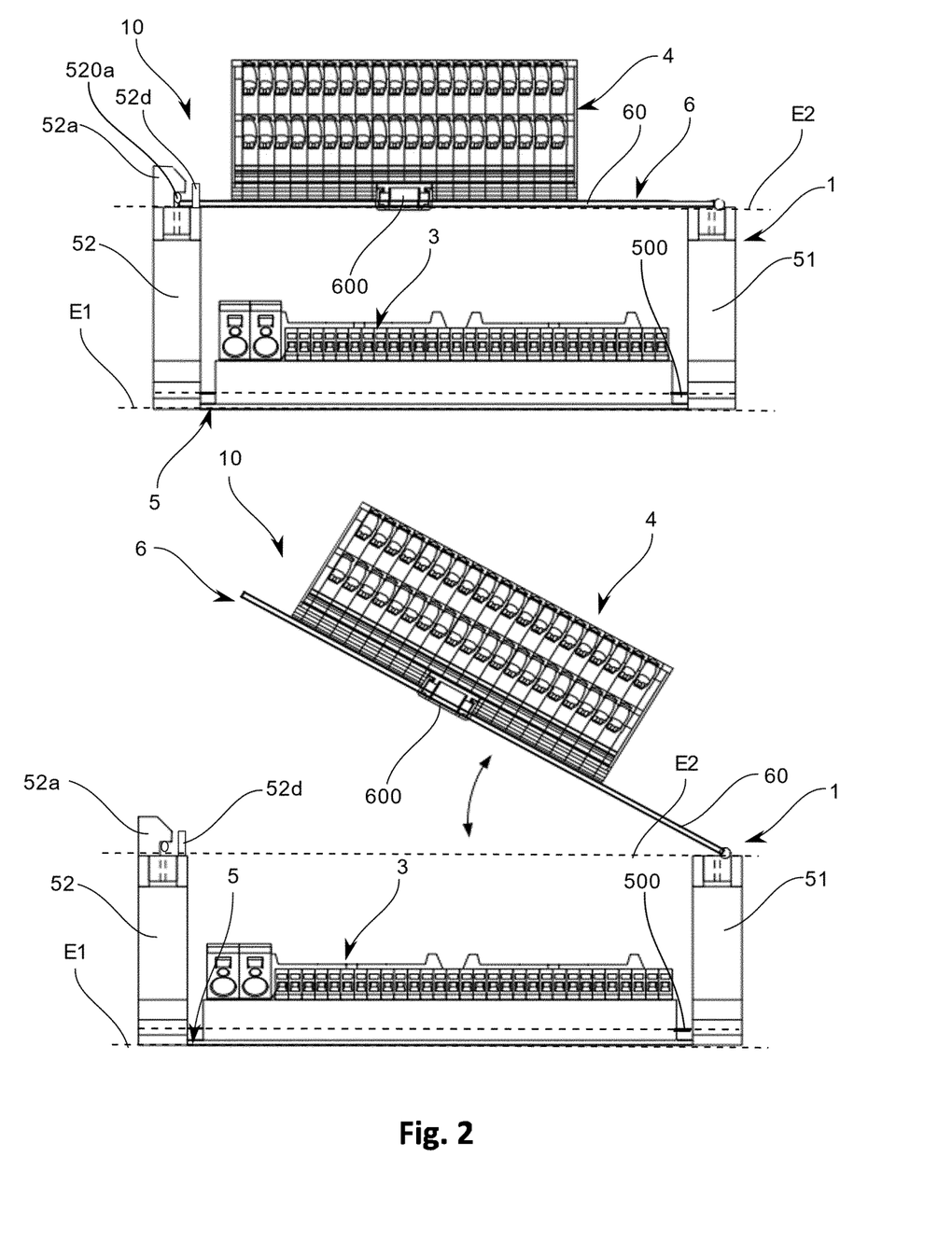
FIG. 2 shows a second embodiment of a device assembly according to the invention in the direction transversely to the longitudinal extension of the first carrier configured as carrier rail, in schematic illustration, in two different operating situations.

FIG. 2 shows a second embodiment of a device assembly 10 according to the invention in a side view, in the direction transversely to the longitudinal extension of the first carrier 5, which is configured as carrier rail 500, in schematic illustration, in two different operating situations. In the upper illustration, the second carrier 6 is aligned parallel to the first carrier 5, in a second mounting plane E2, which is arranged parallel to the first mounting plane E1. The second carrier 6 comprises a mounting plate 60 with a carrier rail 600, which is arranged thereon and which is configured as top-hat rail. Here, the second carrier 6 is connected to the first support element 51 in a pivotably movable manner with its mounting plate 60 in the direction of the longitudinal extension of the first carrier 5. In the operating situation shown in the upper illustration, the mounting plate 60 is thereby fixed in this operating position with its end located opposite the pivot bearing on the first support element 51 via latching means 52a configured on the second support element 52. The mounting plate 60 can be held with low vibration in the support element 52 by means of elastic play compensating means 520a (leaf spring, elastomer, or the like), which exert a contact pressure on the received edge region of the mounting plate 60 within the receptacle of the latching means 52a.

A shifting of the carrier 6 in its mounting plane E2 can be prevented via additional securing means 52d (e.g. in the form of a stop).

In the lower illustration of FIG. 2, the mounting plate 60 is illustrated in a pivoted-out operating position, so that access to the mounting plane E1 located below it (or behind it, respectively) to the first electrical module 3 is made possible.

Figure 3:
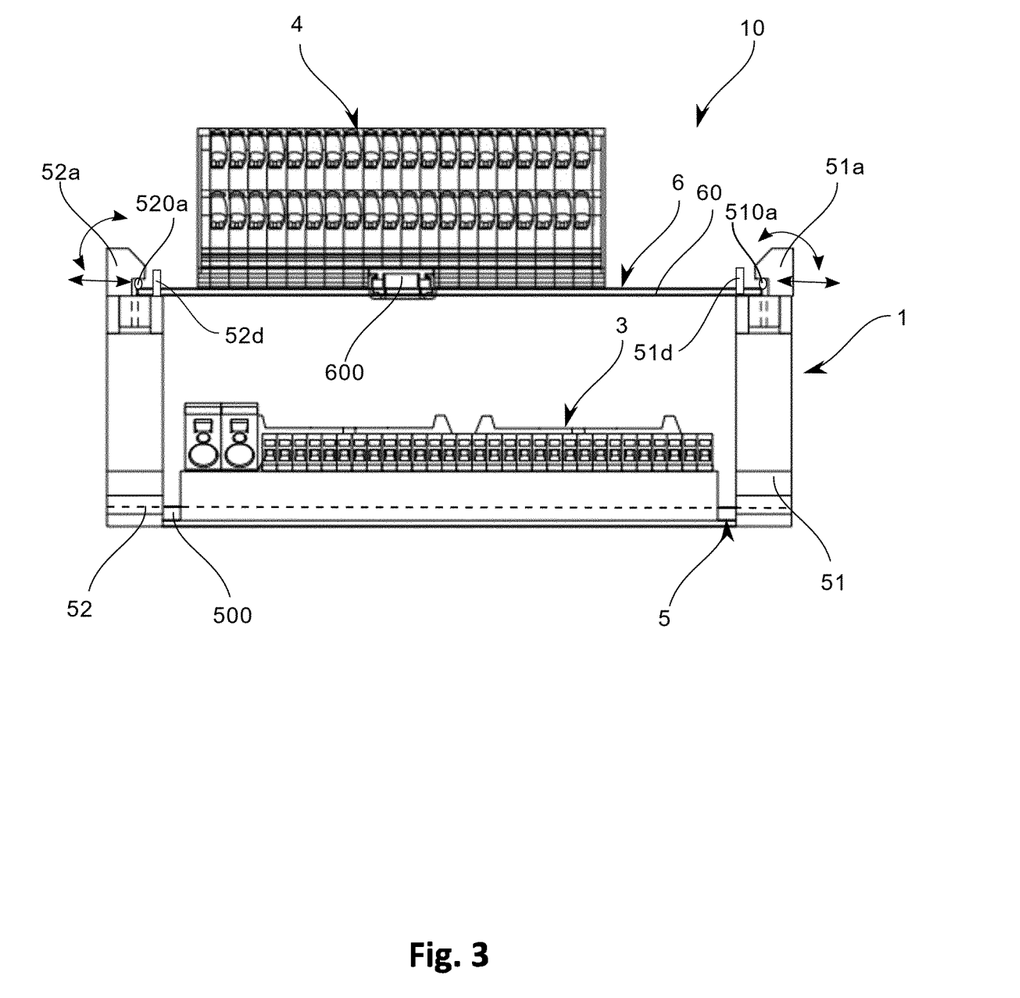
FIG. 3 shows a third embodiment of a device assembly according to the invention in the direction transversely to the longitudinal extension of the first carrier configured as carrier rail, in schematic illustration.

FIG. 3 shows a third embodiment of a device assembly 10 according to the invention in a side view, in the direction transversely to the longitudinal extension of the first carrier 5, which is configured as carrier rail 500, in schematic illustration. Analogously to the upper illustration of FIG. 2, the second carrier 6 is arranged on the support elements 51, 52, aligned parallel to the first carrier 5, in a second mounting plane E2 arranged parallel to the first mounting plane E1. The second carrier 6 likewise comprises a mounting plate 60 with a carrier rail 600 arranged thereon, which is configured as top-hat rail. In contrast to the embodiment shown in FIG. 2, the mounting plate 60 of the second carrier 6 is not connected in a pivotably movable manner to a support element 51, 52, but the mounting plate 60 is rather placed as free separate part onto the support elements 51, 52 and is fixed via latching elements 51a, 52a configured in the support elements 51, 52. The latching elements 51a, 52a can thereby be configured by means of latching arms, which are configured in a spring-elastic manner (see curved double arrows) or by means of fixed latching arms, which can be displaced laterally outwards (see straight double arrows), which are then pushed inwards, applied with a spring force. Analogously to the embodiment according to FIG. 2, the mounting plate 60 is held with low vibration in the support elements 51, 52 by means of elastic play compensating means 520a (leaf spring, elastomer, or the like), which exert a contact pressure on the received edge region of the mounting plate 60 within the receptacle of the latching means 51a, 52a, and is secured against a shifting of the carrier 6 in its mounting plane E2 via additional securing means 52d (e.g. in the form of a stop).

Figure 4:
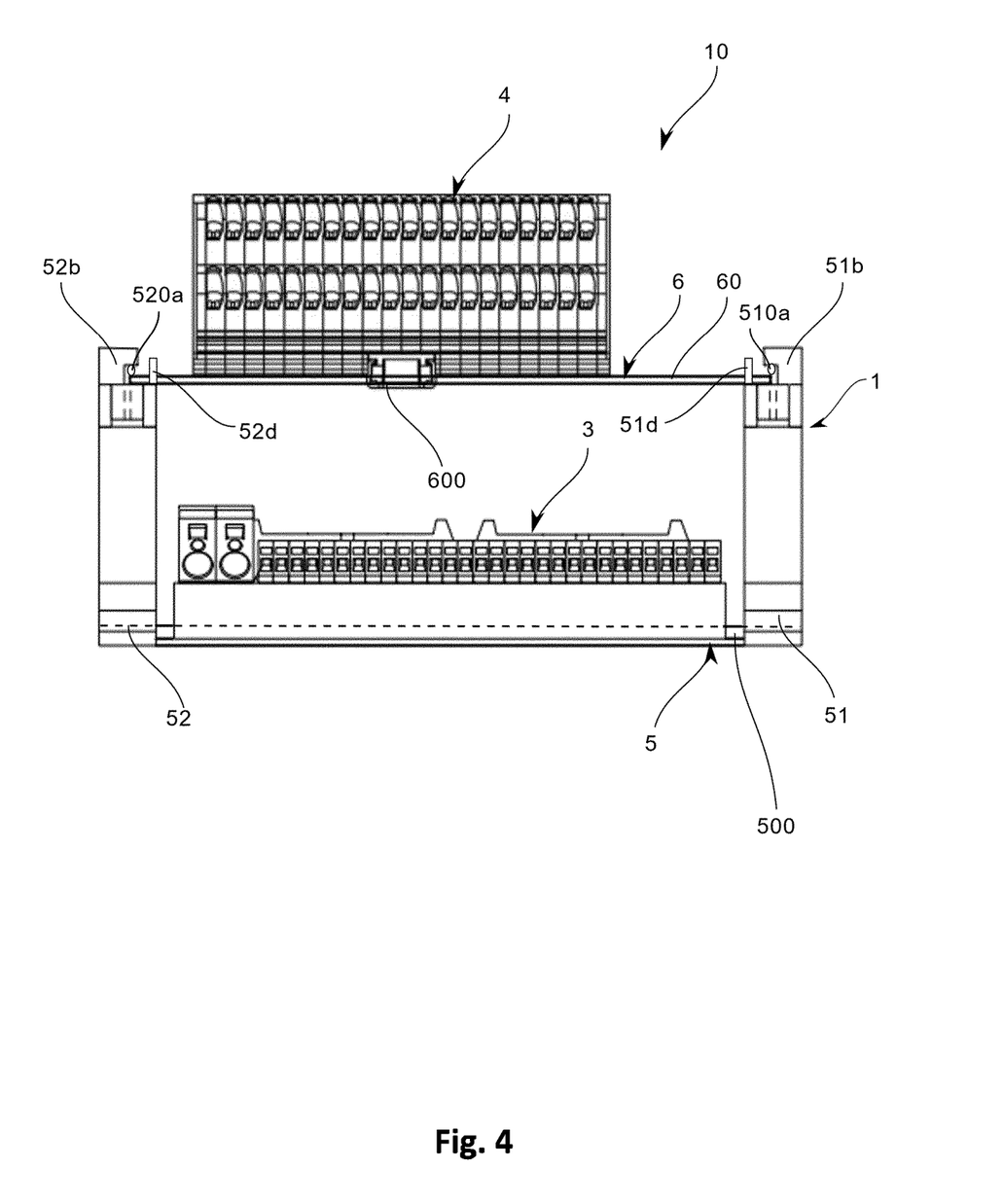
FIG. 4 shows a fourth embodiment of a device assembly according to the invention in the direction transversely to the longitudinal extension of the first carrier configured as carrier rail, in schematic illustration.

FIG. 4 shows a fourth embodiment of a device assembly 10 according to the invention in a side view, in the direction transversely to the longitudinal extension of the first carrier 5, which is configured as carrier rail 500, in schematic illustration. Analogously to the embodiment according to FIG. 3, the second carrier 6 is arranged on the support elements 51, 52, aligned parallel to the first carrier 5, in a second mounting plane E2 arranged parallel to the first mounting plane E1, aligned to the support elements 51, 52. The second carrier 6 likewise comprises a mounting plate 60 with a carrier rail 600 arranged thereon, which is configured as top-hat rail. In contrast to the embodiment shown in FIG. 2, the mounting plate 60 of the second carrier 6 is likewise not connected in a pivotably movable manner to a support element 51, 52, but the mounting plate 60 is rather placed as free separate part onto the support elements 51, 52. In contrast to the embodiment according to FIG. 3, in the case of which the support elements 51, 52 fix the mounting plate 60 via latching arms (latching elements 51a, 52a), which are configured in a spring-elastic (or resilient) manner, the mounting plate 60 in the case of the embodiment according to FIG. 4 is held via guide grooves 51b, 52b configured in the support elements 51, 52—the "latching arms" are configured here quasi rigidly or so as to be stationary, respectively, so that the mounting plate 60 has to be inserted into the guide grooves 51b, 52b. Analogously to the embodiment according to FIG. 2 and FIG. 3, the mounting plate 60 is held with low vibration in the support elements 51, 52 by means of elastic play compensating means 520a (leaf spring, elastomer, or the like), which exert a contact pressure on the received edge region of the mounting plate 60 within the guide grooves 51b, 52b, and is secured against a shifting of the carrier 6 in its mounting plane E2 via additional securing means 52d (e.g. in the form of a stop).

In the embodiments according to FIGS. 2-4, the second carrier 6 in each case comprises a mounting plate 60 with a carrier rail 600 attached thereon. The carrier rails 500, 600 of first carrier 5 and second carrier 6 are thereby aligned orthogonally to one another in their longitudinal extension. In alternative embodiments (not illustrated), the carrier rail 600 of the second carrier 6 can likewise be arranged in the same direction to the carrier rail 500 of the first carrier 5 in its direction of extension.

All illustrated exemplary embodiments have in common that the first support element 51 and the second support element 52 are configured as disk-like side parts, which, on its front side facing the first carrier 5, each have a base section with a recess 51c, 52c for connection to the first carrier 5, which is configured in a rail-like manner. Alternatively (not illustrated here), the support elements 51, 52 can also be screwed or otherwise fastened to a base plate or a side wall of a control cabinet or the like.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

1 Mounting assembly
3 First electrical module
4 Second electrical module
5 First carrier
500 Carrier rail
6 Second carrier
600 Carrier rail
10 Device assembly
51 First support element
51a Latching means
51b Guide means
51c Recess (for carrier rail fastening)
51d Securing means
510a Play compensating means
52 Second support element
52a Latching means
52b Guide means
52c Recess (for carrier rail fastening)
52d Securing means
520a Play compensating means
E1 First mounting plane
E2 Second mounting plane
K Cable duct

The invention claimed is:

1. A mounting assembly for mounting at least two electrical modules, which are arrangeable at different levels above one another, comprising:
   a first electrical module arrangeable on a first carrier in a first mounting plane;
   a second electrical module arrangeable on a second carrier in a second mounting plane arranged above the first mounting plane;
   a separate first support element on a first side of the first electrical module; and
   a separate second support element, which is axially spaced apart from the first support element, on a second side of the first electrical module,
   wherein the second carrier is arrangeable spaced apart from the first carrier above the latter by the first support element and by the second support element,
   wherein the first support element has a first receiving arm, which is mounted in a pivotably movable manner transversely to a longitudinal extension of the first carrier,
   wherein the second support element has a second receiving arm, which is mounted in a pivotably movable manner transversely to the longitudinal extension of the first carrier,
   wherein the second carrier is arrangeable on the pivotably movable receiving arms, and
   wherein the first receiving arm, which is mounted in a pivotably movable manner, and/or the second receiving arm, which is mounted in a pivotably movable manner, is/are fixable at least in one position, and is/are latchable to the first support element and/or to the second support element via latching means.

2. The mounting assembly of claim 1, wherein the first carrier and/or the second carrier comprise a carrier rail with a top-hat profile.

3. The mounting assembly of claim 1, wherein the second carrier is connected to the first support element in a pivotably movable manner in a plane perpendicular to the first mounting plane in a direction of a longitudinal extension of the first carrier.

4. The mounting assembly of claim 3, wherein the second carrier is arrangeable so as to be held on the second support element via latching means in an operating mounting state of the mounting assembly.

5. The mounting assembly of claim 1, wherein the second carrier is placeable onto the support elements and is arrangeable so as to be held on the first support element via first latching means and on the second support element via second latching means.

6. The mounting assembly of claim 1, wherein the second carrier is arrangeable so as to be held on the first support element via first guide means and on the second support element via second guide means.

7. The mounting assembly of claim 6, wherein the first guide means and/or the second guide means have elastic play compensating means configured to exert a contact pressure within the first guide means and/or second guide means on parts guided within the first guide means and/or second guide means.

8. The mounting assembly of claim 4, further comprising:
securing means configured such that a displacement path of the second carrier in the second mounting plane of the second carrier is limited.

9. The mounting assembly of claim 1, wherein the first carrier and the second carrier are aligned in parallel in a longitudinal extension thereof.

10. The mounting assembly of claim 1, wherein the first carrier and the second carrier are aligned orthogonally to one another in a longitudinal extension thereof, and
wherein the second carrier comprises a mounting plate with a carrier rail arranged thereon.

11. The mounting assembly of claim 1, wherein the first support element and/or the second support element comprises disk-like side parts, which, on a front side facing the first carrier, each comprise a base section with a recess for connection to the first carrier, which is configured in a rail-like manner.

12. The mounting assembly of claim 11, wherein, starting at a base section viewed in a side view, the first support element and/or the second support element are configured in an L-shaped manner.

13. A device assembly, comprising:
the mounting assembly of claim 1,
wherein a first electrical module is arranged on the first carrier, and
wherein a second electrical module is arranged on the second carrier.

14. The device assembly of claim 13, wherein the first electrical module comprises an electrical board with output lines with a first line cross-section, and
wherein the second electrical module comprises a transfer module, which receives the output lines of the first electrical module on the input side, and which is equippable on an output side with transfer board output lines with a line cross-section, which is enlarged compared to the first line cross-section, so that larger line cross sections are enabled between the first electrical module and a further third electrical module, which is to be connected thereto.

15. The device assembly of claim 13, wherein the first electrical module comprises an electrical securing device without galvanic separation, and
wherein the second electrical module comprises a module providing a galvanic separation, which receives the output lines of the first electrical module on an input side so that a galvanic separation is realized between the input side of the first electrical module and output side of the second electrical module.

16. A device assembly, comprising:
a mounting assembly for mounting at least two electrical modules, which are arrangeable at different levels above one another, comprising:
a first electrical module arrangeable on a first carrier in a first mounting plane;
a second electrical module arrangeable on a second carrier in a second mounting plane arranged above the first mounting plane;
a separate first support element on a first side of the first electrical module; and
a separate second support element, which is axially spaced apart from the first support element, on a second side of the first electrical module,
wherein the second carrier is arrangeable spaced apart from the first carrier above the latter by the first support element and by the second support element,
wherein a first electrical module is arranged on the first carrier,
wherein a second electrical module is arranged on the second carrier,
wherein the first electrical module comprises an electrical board with output lines with a first line cross-section, and
wherein the second electrical module comprises a transfer module, which receives the output lines of the first electrical module on the input side, and which is equippable on an output side with transfer board output lines with a line cross-section, which is enlarged compared to the first line cross-section, so that larger line cross sections are enabled between the first electrical module and a further third electrical module, which is to be connected thereto.

17. A device assembly, comprising:
a mounting assembly for mounting at least two electrical modules, which are arrangeable at different levels above one another, comprising:
a first electrical module arrangeable on a first carrier in a first mounting plane;
a second electrical module arrangeable on a second carrier in a second mounting plane arranged above the first mounting plane;
a separate first support element on a first side of the first electrical module; and
a separate second support element, which is axially spaced apart from the first support element, on a second side of the first electrical module,
wherein the second carrier is arrangeable spaced apart from the first carrier above the latter by the first support element and by the second support element,
wherein a first electrical module is arranged on the first carrier,
wherein a second electrical module is arranged on the second carrier,
wherein the first electrical module comprises an electrical securing device without galvanic separation, and
wherein the second electrical module comprises a module providing a galvanic separation, which receives the output lines of the first electrical module on an input side so that a galvanic separation is realized between the input side of the first electrical module and output side of the second electrical module.

\* \* \* \* \*